(12) United States Patent
Eguchi et al.

(10) Patent No.: US 8,183,163 B2
(45) Date of Patent: May 22, 2012

(54) ETCHING LIQUID, ETCHING METHOD, AND METHOD OF MANUFACTURING ELECTRONIC COMPONENT

(75) Inventors: Katsuya Eguchi, Kanagawa-ken (JP); Naoya Hayamizu, Kanagawa-ken (JP); Hiroyuki Fukui, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 572 days.

(21) Appl. No.: 11/690,438

(22) Filed: Mar. 23, 2007

(65) Prior Publication Data

US 2008/0064223 A1    Mar. 13, 2008

(30) Foreign Application Priority Data

Sep. 12, 2006 (JP) .................................. 2006-246785

(51) Int. Cl.
*H01L 21/302* (2006.01)
*H01L 21/461* (2006.01)
(52) U.S. Cl. .......................................... 438/757; 216/99
(58) Field of Classification Search .................... 216/99; 438/757
See application file for complete search history.

(56) References Cited

U.S. PATENT DOCUMENTS

| | | | |
|---|---|---|---|
| 3,715,249 A | 2/1973 | Panousis et al. | |
| 3,953,263 A * | 4/1976 | Ishikawa et al. | 216/108 |
| 4,545,017 A | 10/1985 | Richardson | 702/9 |
| 4,660,419 A | 4/1987 | Derkacs et al. | 73/622 |
| 4,700,142 A | 10/1987 | Kuckes | 340/853.5 |
| 4,779,201 A | 10/1988 | Iisuka et al. | 702/10 |
| 4,851,773 A | 7/1989 | Rothstein | 324/220 |
| 5,039,587 A * | 8/1991 | Czech et al. | 430/111.34 |
| 5,051,962 A | 9/1991 | Eaton | 367/33 |
| 5,164,049 A * | 11/1992 | Clark et al. | 203/40 |
| 5,218,301 A | 6/1993 | Kuckes | 324/346 |
| 5,237,539 A | 8/1993 | Selman | 367/69 |
| 5,278,549 A | 1/1994 | Crawford | 340/853.2 |
| 5,491,668 A | 2/1996 | Priest | 367/35 |
| 5,626,192 A | 5/1997 | Connell et al. | 166/255.1 |
| 5,885,903 A * | 3/1999 | Torek et al. | 438/756 |
| 5,947,213 A | 9/1999 | Angle et al. | 175/24 |
| 6,079,490 A | 6/2000 | Newman | 166/77.51 |
| 6,171,945 B1 * | 1/2001 | Mandal et al. | 438/622 |
| 6,209,639 B1 | 4/2001 | Newman | 166/250.01 |
| 6,411,084 B1 | 6/2002 | Yoo | 324/221 |
| 6,582,279 B1 * | 6/2003 | Fox et al. | 451/37 |
| 6,666,986 B1 | 12/2003 | Vaartstra | |

(Continued)

FOREIGN PATENT DOCUMENTS

JP          07-211690 A         8/1995

(Continued)

OTHER PUBLICATIONS

Korean Office action for 10-2007-91967, dated Apr. 30, 2009.

(Continued)

*Primary Examiner* — Roberts Culbert
(74) *Attorney, Agent, or Firm* — Pearne & Gordon LLP (57) ABSTRACT

An etching liquid used for selectively etching silicon nitride, the etching liquid includes: water; a first liquid that can be mixed with the water to produce a mixture liquid having a boiling point of 150° C. or more; and a second liquid capable of producing protons ($H^+$). Alternatively, an etching liquid includes: water; phosphoric acid; and sulfuric acid, the phosphoric acid and the sulfuric acid having a volume ratio of 300:32 to 150:300.

4 Claims, 8 Drawing Sheets

CROSS-SECTIONAL CONFIGURATION IN THE FIRST ETCHING

CROSS-SECTIONAL CONFIGURATION IN THE 21ST ETCHING

U.S. PATENT DOCUMENTS

| | | | |
|---|---|---|---|
| 6,728,638 B2 | 4/2004 | Newman | 702/5 |
| 6,896,056 B2 | 5/2005 | Mendez et al. | 166/254.2 |
| 7,006,920 B2 | 2/2006 | Newman et al. | 702/6 |
| 2004/0226712 A1 | 11/2004 | Hood et al. | 166/66 |
| 2004/0253830 A1* | 12/2004 | Chang | 438/745 |

FOREIGN PATENT DOCUMENTS

| | | |
|---|---|---|
| JP | 2000-058500 | 2/2000 |
| JP | 2001-284314 | 10/2001 |
| JP | 2005-203467 A | 7/2005 |
| JP | 2006-108716 A | 4/2006 |
| JP | 2006-319171 | 11/2006 |
| JP | 2007-012640 | 1/2007 |
| KR | 0006101 B | 10/1978 |
| WO | 2005/067019 A1 | 7/2005 |

OTHER PUBLICATIONS

Korean Patent Office Action dated May 29, 2008.
Taiwanese Office action for 096112129 dated Dec. 8, 2010.
Taiwanese Office action for 096112129 dated Apr. 1, 2011.
Japanese Office action for 2006-246785 dated Jun. 13, 2011.

* cited by examiner

CROSS-SECTIONAL CONFIGURATION
IN THE FIRST ETCHING

CROSS-SECTIONAL CONFIGURATION
IN THE 21ST ETCHING

H$_2$SO$_4$ 160ml + H$_3$PO$_4$ 300ml +
AMMONIUM PEROXODISULFATE

FIG. 7C $H_2SO_4$ 160ml + $H_3PO_4$ 300ml + AMMONIUM PEROXODISULFATE 0.2mol/l

US 8,183,163 B2

ETCHING LIQUID, ETCHING METHOD, AND METHOD OF MANUFACTURING ELECTRONIC COMPONENT

CROSS-REFERENCE TO RELATED APPLICATIONS

This application is based upon and claims the benefit of priority from the prior Japanese Patent Application No. 2006-246785, filed on Sep. 12, 2006; the entire contents of which are incorporated herein by reference.

BACKGROUND OF THE INVENTION

1. Field of the Invention

This invention relates to an etching liquid, an etching method, and a method of manufacturing an electronic component, and more particularly to an etching liquid, an etching method, and a method of manufacturing an electronic component where silicon nitride can be selectively etched.

2. Background Art

The process of manufacturing electronic components such as semiconductor device, liquid crystal displays, and phase shift masks includes wet etching for selectively removing silicon nitride film. For example, regarding semiconductor device, a nitride film (silicon nitride film, $Si_3N_4$) is used as a hard mask for forming a device isolation oxide film (silicon oxide film, $SiO_2$ film) on a wafer. To remove such nitride film, wet etching with heated phosphoric acid solution, called the hot phosphoric acid process, is typically used. The hot phosphoric acid solution (etching liquid) has the property of having a higher etching rate of silicon nitride film ($Si_3N_4$) relative to that of silicon oxide film ($SiO_2$ film). Hence it has been used for selectively removing a hard mask made of silicon nitride film ($Si_3N_4$) without removing device isolation oxide film made of silicon oxide film ($SiO_2$ film).

With the recent demand for high integration and downscaling, the device isolation structure of a semiconductor device is in transition from LOCOS (Local Oxidation of Silicon) structure to STI (Shallow Trench Isolation) structure. However, if the conventional wet etching with hot phosphoric acid solution (etching liquid) is used for the STI (Shallow Trench Isolation) structure, the device isolation oxide film (silicon oxide film, $SiO_2$ film) is removed during removing the hard mask (silicon nitride film, $Si_3N_4$) because of the insufficient selection ratio. This may cause trouble in the shape and size of the wafer cross section in the vicinity of the trench.

Conventionally proposed etching liquids for wet etching include an etching liquid with increased etching rate of silicon nitride film relative to that of silicon oxide film (see JP 2000-058500A) and an etching liquid for etching oxide film and nitride semiconductor (see JP 2001-284314A).

However, in the technique disclosed in JP 2000-058500A, a silicon-containing organic compound dissolved in a solvent is added to a phosphoric acid solution. Thus, unfortunately, silicon added or dispersed in the phosphoric acid solution may be adsorbed or precipitated on the pattern of a wafer.

On the other hand, JP 2001-284314A relates to a technique for increasing the etching rate of sapphire ($Al_2O_3$) relative to that of nitride semiconductor. This etching liquid cannot etch silicon nitride film ($Si_3N_4$).

SUMMARY OF THE INVENTION

According to an aspect of the invention, there is provided an etching liquid used for selectively etching silicon nitride, the etching liquid including: water; a first liquid that can be mixed with the water to produce a mixture liquid having a boiling point of 150° C. or more; and a second liquid capable of producing protons (H+).

According to another aspect of the invention, there is provided an etching liquid used for selectively etching silicon nitride, the etching liquid including: water; phosphoric acid; and sulfuric acid, the phosphoric acid and the sulfuric acid having a volume ratio of 300:32 to 150:300.

According to another aspect of the invention, there is provided an etching method including: selectively etching silicon nitride by using at least one of first and second etching liquids, the first etching liquid including: water; a first liquid that can be mixed with the water to produce a mixture liquid having a boiling point of 150° C. or more; and a second liquid capable of producing protons (H+), and the second etching liquid including:
water; phosphoric acid; and sulfuric acid, the phosphoric acid and the sulfuric acid having a volume ratio of 300:32 to 150:300.

According to an aspect of the invention, there is provided A method of manufacturing an electronic component including: selectively etching silicon nitride to form a pattern by using the etching method including: etching silicon nitride by using at least one of first and second etching liquids, the first etching liquid including: water; a first liquid that can be mixed with the water to produce a mixture liquid having a boiling point of 150° C. or more; and a second liquid capable of producing protons (H+), and the second etching liquid including: water; phosphoric acid; and sulfuric acid, the phosphoric acid and the sulfuric acid having a volume ratio of 300:32 to 150:300.

DETAILED DESCRIPTION OF THE INVENTION

An embodiment of the invention will now be described with reference to the drawings.

Figure 1:
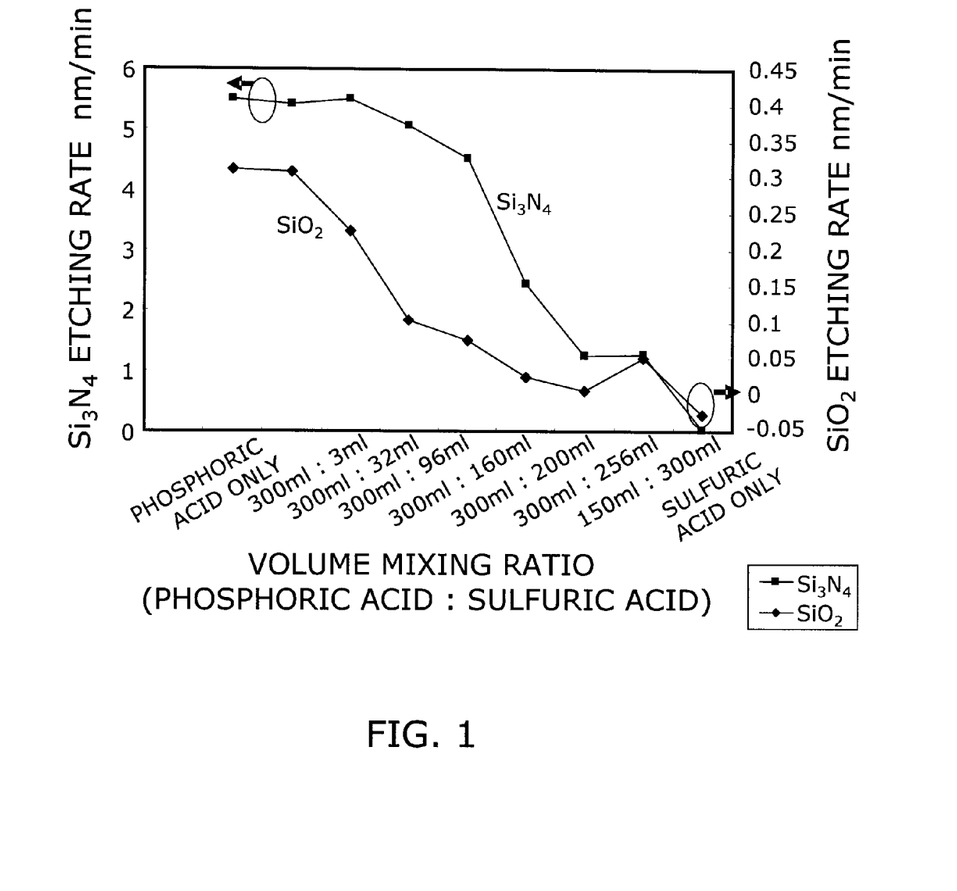
FIG. 1 is a graph for illustrating the relationship between the volume mixing ratio and the etching rate of an etching liquid according to an embodiment of the invention.

FIG. 1 is a graph for illustrating the relationship between the volume mixing ratio and the etching rate of an etching liquid according to the embodiment of the invention.

The left vertical axis represents the etching rate of silicon nitride film ($Si_3N_4$), and the right vertical axis represents the etching rate of silicon oxide film ($SiO_2$). The horizontal axis represents the volume mixing ratio of the etching liquid (phosphoric acid:sulfuric acid).

First, the etching mechanism of silicon nitride film ($Si_3N_4$) and silicon oxide film ($SiO_2$) in the hot phosphoric acid process is described. The etching mechanism in the hot phosphoric acid process has yet to be completely understood, but it is considered to be as follows.

Presumably, according to the hot phosphoric acid process, silicon nitride film ($Si_3N_4$) is turned into water-soluble $Si(OH)_4$ by the chemical reaction given by the following formula (1), and consequently, silicon nitride film ($Si_3N_4$) is etched. Here, typically, water ($H_2O$) is not separately added, but contained in phosphoric acid ($H_3PO_4$).

(1)

On the other hand, typically, silicon oxide film ($SiO_2$) can be etched by alkali, but cannot by acid (phosphoric acid). However, at high temperatures of 150° C. or more in the hot phosphoric acid process, silicon oxide film ($SiO_2$) can be etched. This is presumably because, at high temperatures, water ($H_2O$) contained in phosphoric acid ($H_3PO_4$) is ionized to produce $OH^-$, which triggers the chemical reaction given by the formula (2) to produce water-soluble $Si(OH)_4$. Furthermore, $Si(OH)_4$ generated in this reaction disturbs the right-hand side equilibrium of the formula (1) to produce $SiO_2$. Thus the etching rate of silicon oxide film ($SiO_2$) becomes lower than the etching rate of silicon nitride film ($Si_3N_4$). Consequently, silicon nitride film ($Si_3N_4$) can be selectively removed.

(2)

In the hot phosphoric acid process, selective etching of silicon nitride film ($Si_3N_4$) is performed as described above. However, it turned out that, when the treatment of the hot phosphoric acid process is repeated using the same etching liquid (phosphoric acid, $H_3PO_4$), the etching rate of silicon oxide film ($SiO_2$) significantly varies with the number of treatments.

Figure 2:
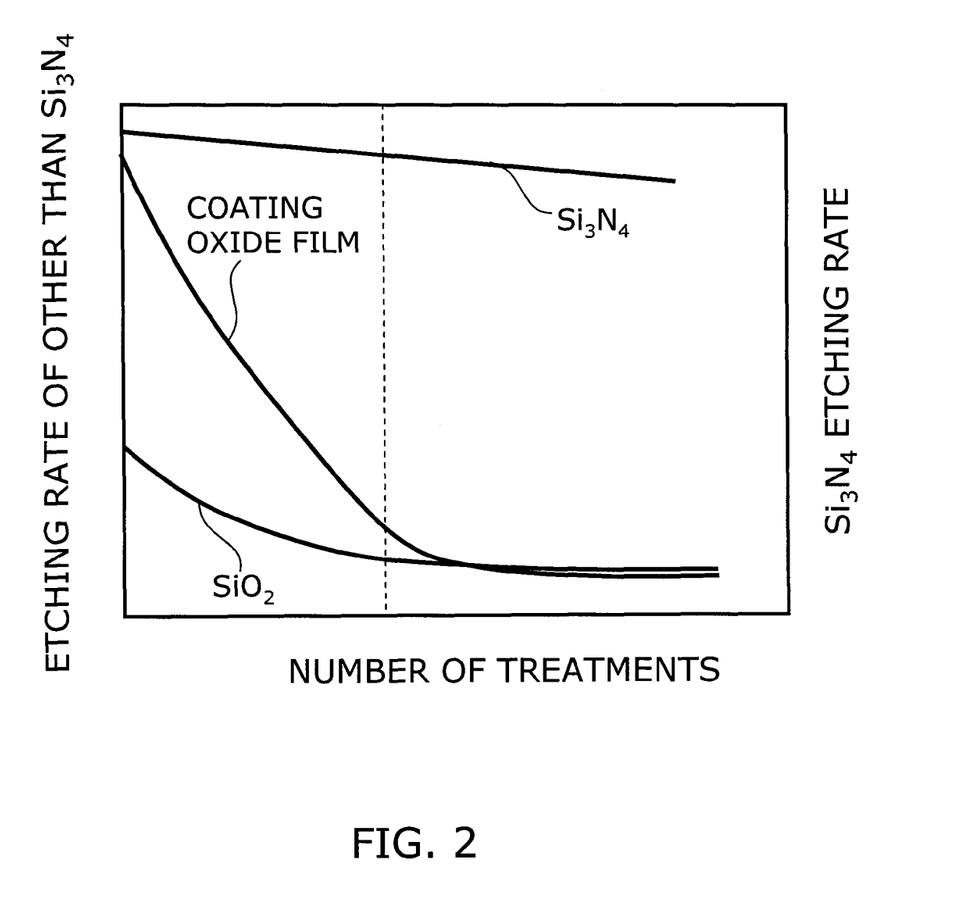
FIG. 2 is a graph for illustrating the relationship between the number of treatments and the etching rate.

FIG. 2 is a graph for illustrating the relationship between the number of treatments and the etching rate.

The left vertical axis represents the etching rate of other than silicon nitride film ($Si_3N_4$), and the right vertical axis represents the etching rate of silicon nitride film ($Si_3N_4$). The horizontal axis represents the number of treatments. "Coating oxide film" in the figure refers to the film made of silicon oxide ($SiO_2$) and deposited by applying a coating liquid for forming silica-based coating.

It is seen from FIG. 2 that the etching rate of silicon nitride film ($Si_3N_4$) scarcely varies with the increasing number of treatments. However, the etching rate of the coating oxide film and silicon oxide film ($SiO_2$) rapidly decreases with the number of treatments. This is presumably because silicon oxide ($SiO_2$) removed and dissolved into the etching liquid increases with the number of treatments and inhibits the reaction given by the formula (2). When the number of treatments is 10 or less (on the left side of the dashed line in the figure), the etching rate of the coating oxide film and silicon oxide film ($SiO_2$) is too high to selectively etch silicon nitride film ($Si_3N_4$). Furthermore, large variation causes a problem in controlling the size and shape resulting from etching. Here, the hot phosphoric acid process is performed under the treatment condition that the etching liquid is phosphoric acid ($H_3PO_4$) and the treatment temperature is 160° C.

Here, the coating oxide film has a higher etching rate than silicon oxide film ($SiO_2$) despite the same material, silicon oxide ($SiO_2$). The reason for this is that, because of its porous structure, the coating oxide film has a low density and a large contact area with the etching liquid, thereby being more susceptible to etching.

FIG. 3 is a diagram for illustrating the effect of the number of treatments.

Figure 3A:
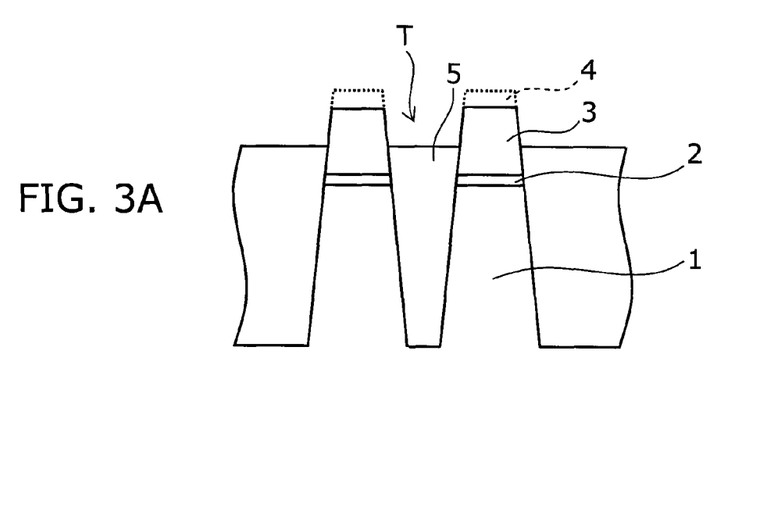
FIG. 3 is a diagram for illustrating the effect of the number of treatments.
Figure 3B:
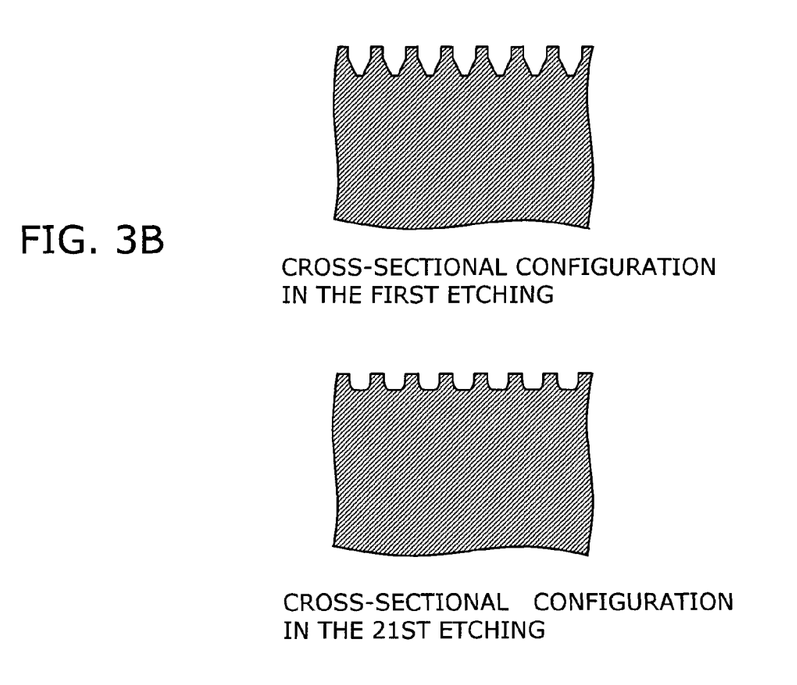

FIG. 3A is a schematic diagram for illustrating the configuration of a wafer cross section. FIG. 3B shows schematic cross sections of a wafer for illustrating the effect of the number of treatments on the size and shape resulting from etching.

First, the configuration of a wafer cross section is briefly described. As shown in FIG. 3A, on a silicon layer 1 made of single crystal silicon, an insulating layer 2 made of silicon oxide ($SiO_2$), a polysilicon layer 3 made of polycrystalline silicon, and a mask 4 made of silicon nitride ($Si_3N_4$) are laminated sequentially from below. A coating oxide film 5 is buried in the trench T. The schematic cross-sectional views of FIG. 3B show the configuration after the mask 4 is removed by the hot phosphoric acid process.

In FIG. 3B, the upper schematic cross-sectional view schematically shows the cross section of a wafer resulting from the first etching treatment, and the lower schematic cross-sectional view schematically shows the cross section of a wafer resulting from the 21st etching treatment. As described with reference to FIG. 2, in the first etching treatment, a sufficient selection ratio is not achieved. Furthermore, the etching rate of the coating oxide film 5 ($SiO_2$) and silicon oxide film ($SiO_2$) is too high and varies significantly. Thus, as shown in the upper schematic cross-sectional view of FIG. 3B, when the mask 4 (silicon nitride film, $Si_3N_4$) is removed, the polysilicon layer 3 and the coating oxide film 5 ($SiO_2$) are also partially removed.

In the configuration shown in the upper schematic cross-sectional view of FIG. 3B, as compared with the configuration shown in the lower schematic cross-sectional view of FIG. 3B, the corners (of the peaks) of the polysilicon layer 3 are removed, and the width (of the peaks) is narrowed. Furthermore, the upper face portion of the coating oxide film 5 is also removed to form grooves.

On the other hand, as described with reference to FIG. 2, in the 21st etching treatment, a sufficient selection ratio is achieved. Furthermore, the etching rate of the coating oxide film and silicon oxide film ($SiO_2$) is low and stable. Thus, as shown in the lower schematic cross-sectional view of FIG. 3B, even when the mask 4 (silicon nitride film, $Si_3N_4$) is removed, the polysilicon layer 3 and the coating oxide film 5 are not removed, and a wafer having desired shape and size is obtained.

Here, the hot phosphoric acid process is performed under the treatment condition that the etching liquid is phosphoric acid ($H_3PO_4$) and the treatment temperature is 160° C.

Such dependence on the number of treatments greatly affects the quality of semiconductor device. In particular, the effect becomes very large in the context of recent high integration and downscaling. Thus an etching liquid is required which achieves a sufficient selection ratio and a stable etching rate from the beginning of treatment.

As a result of investigation, the inventor has recognized the following. If $OH^-$ on the left-hand side of the formula (2) can be decreased, the reaction of the formula (2) does not proceed, and the etching rate of silicon oxide film ($SiO_2$) can be reduced. Thus a sufficient selection ratio and a stable etching rate are achieved from the beginning of treatment.

Specifically, $OH^-$ can be decreased by being reacted with $H^+$ to produce water ($H_2O$). This can be achieved by adding an acid capable of producing $H^+$. Here, considering the practical temperature in the hot phosphoric acid process, it is preferable that the added acid have a boiling point of 150° C. or more and can be mixed with water ($H_2O$).

As an example of this kind, sulfuric acid ($H_2SO_4$) can be used. In this case, the effect of sulfuric acid ($H_2SO_4$) is attributable to the following reaction:

$$H_2SO_4 \rightarrow 2H^+ + SO_4^{2-} \quad (3)$$

$$Si_3N_4 + SO_4^{2-} \rightarrow 3SiO_2 + 4NH_4^+ + SO_3^{2-} \quad (4)$$

That is, as indicated by the formula (3), sulfuric acid ($H_2SO_4$) is ionized to produce $H^+$, which is combined with $OH^-$ on the right-hand side of the formula (2) to form water ($H_2O$), thereby decreasing $OH^-$. This prevents the reaction of the formula (2) from proceeding, and consequently decreases the etching rate of silicon oxide film ($SiO_2$).

Furthermore, as indicated by the formula (4), $SO_4^{2-}$ produced in the formula (3) reacts with silicon nitride film ($Si_3N_4$) to produce $SiO_2$. Consequently, this further decreases the etching rate of silicon oxide film ($SiO_2$), and increases the etching rate of silicon nitride film ($Si_3N_4$).

Returning to FIG. 1, the effect of adding sulfuric acid ($H_2SO_4$) is described. As shown in FIG. 1, as the proportion of sulfuric acid ($H_2SO_4$) in the volume mixing ratio (phosphoric acid:sulfuric acid) of the etching liquid is increased, the etching rate of silicon nitride film ($Si_3N_4$) and the etching rate of silicon oxide film ($SiO_2$) are both decreased.

Figure 4:
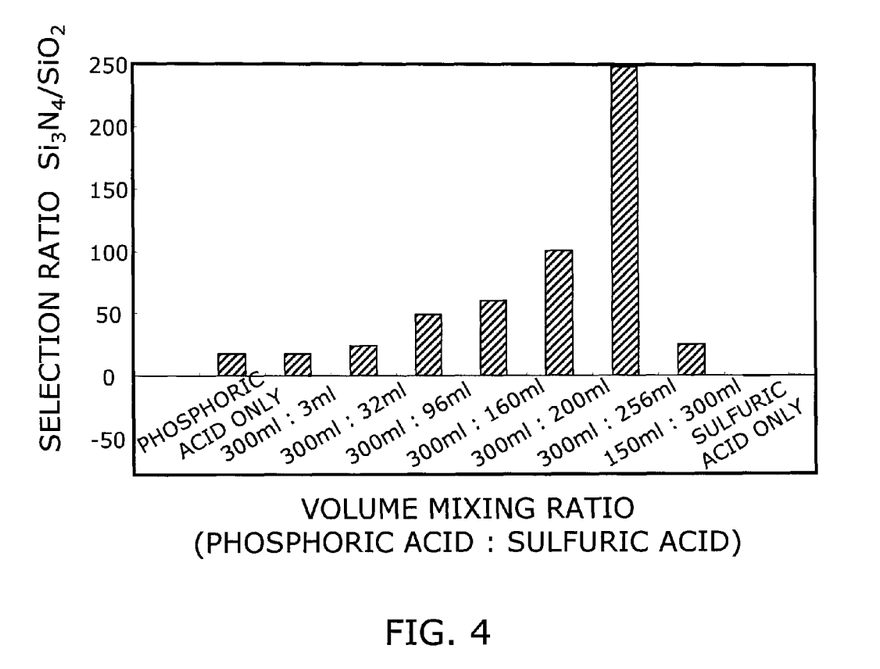
FIG. 4 is a graph for illustrating the effect of the amount of added sulfuric acid ($H_2SO_4$) on the selection ratio ($Si_3N_4/SiO_2$).

FIG. 4 is a graph for illustrating the effect of the amount of added sulfuric acid ($H_2SO_4$) on the selection ratio ($Si_3N_4/SiO_2$).

As shown in FIG. 4, as the proportion of sulfuric acid ($H_2SO_4$) in the volume mixing ratio (phosphoric acid:sulfuric acid) of the etching liquid is increased within a certain range, the selection ratio ($Si_3N_4/SiO_2$) is exponentially increased.

Thus, as the proportion of sulfuric acid ($H_2SO_4$) increases, the etching rate decreases, and the selection ratio increases. This also implies that, as the proportion of sulfuric acid ($H_2SO_4$) increases, the controllability of accuracy in shape and size resulting from etching is improved.

Here, the inventor has recognized that varying the volume mixing ratio (phosphoric acid:sulfuric acid) of the etching liquid allows selection and adjustment of accuracy in size and shape and productivity resulting from etching.

For example, as seen from FIGS. 1 and 4, by increasing the proportion of sulfuric acid ($H_2SO_4$), the etching rate of silicon oxide film ($SiO_2$) and silicon nitride film ($Si_3N_4$) can be both decreased, and the selection ratio can be increased.

Thus, by increasing the proportion of sulfuric acid ($H_2SO_4$), it is possible to respond to treatments requiring high accuracy in size and shape for high integration and downscaling. On the other hand, by decreasing the proportion of sulfuric acid ($H_2SO_4$), the etching rate of silicon oxide film ($SiO_2$) and silicon nitride film ($Si_3N_4$) can be both increased. Hence, by decreasing the proportion of sulfuric acid ($H_2SO_4$), it is also possible to respond to treatments requiring relatively modest accuracy in size and shape but high productivity.

From these viewpoints, a preferable volume mixing ratio of phosphoric acid:sulfuric acid is illustratively in the range of about 300:32 to 150:300. Within this range, an appropriate volume mixing ratio can be selected considering the tradeoff between the required accuracy in shape and size and the productivity.

The etching liquid according to the embodiment of the invention allows easy selection and adjustment of the accuracy in size and shape and productivity by the proportion of sulfuric acid ($H_2SO_4$). Thus, also in the process of manufacturing wafers, selection and adjustment of accuracy in size and shape and productivity can be easily performed simply by adjusting the proportion of sulfuric acid ($H_2SO_4$). Furthermore, the existing system for hot phosphoric acid treatment can be directly used without any modification.

Figure 5:
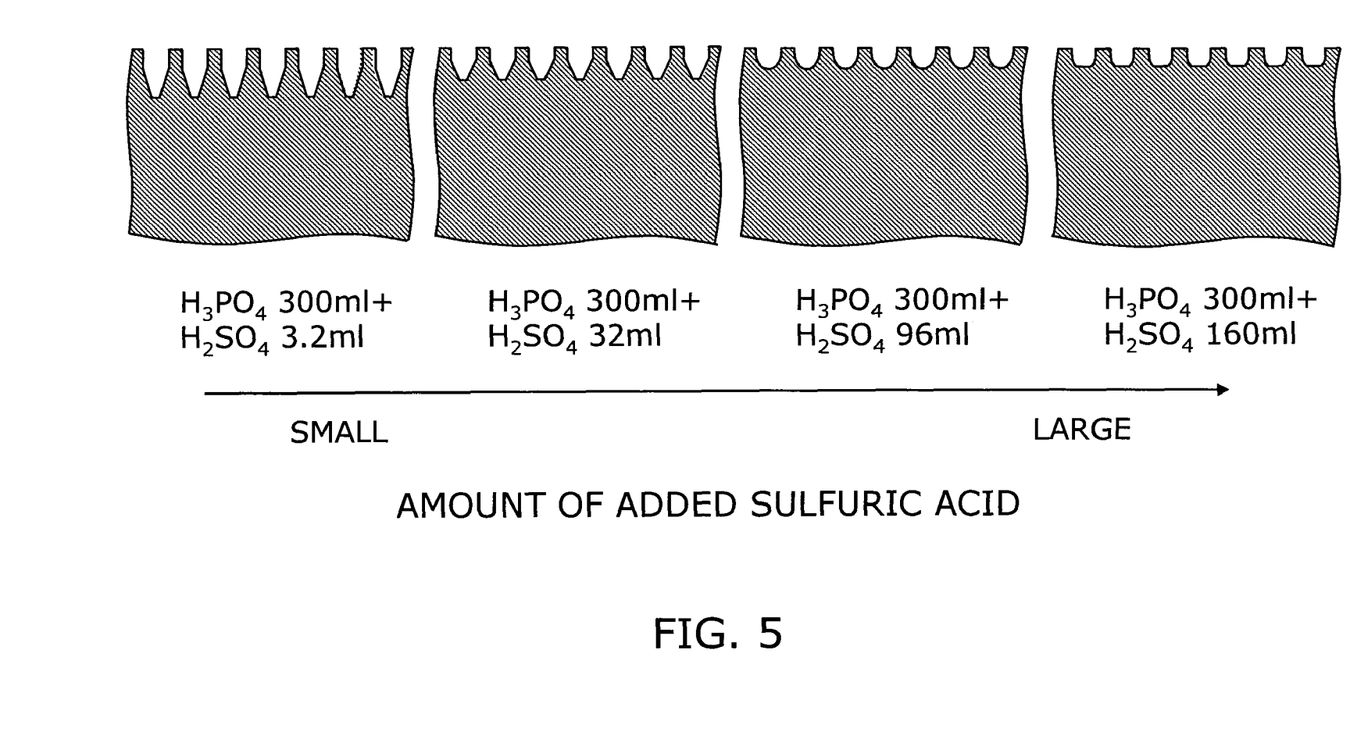
FIG. 5 is a schematic cross-sectional view of a wafer for illustrating the effect of the proportion of sulfuric acid ($H_2SO_4$) on etching.

FIG. 5 is a schematic cross-sectional view of a wafer for illustrating the effect of the proportion of sulfuric acid ($H_2SO_4$) on etching.

The configuration of the wafer cross section is similar to that described with reference to FIG. 3A, and hence is not described here.

As shown in FIG. 5, in an etching liquid having a small proportion of sulfuric acid ($H_2SO_4$), the silicon layer 3 and the coating oxide film 5 ($SiO_2$) are also partially removed when the mask 4 (silicon nitride film, $Si_3N_4$) is removed. As the proportion of sulfuric acid ($H_2SO_4$) is increased, the amount of partial removal of the polysilicon layer 3 and the coating oxide film 5 ($SiO_2$) is decreased. This is because, as described with reference to FIG. 4, the selection ratio of silicon nitride film ($Si_3N_4$) to silicon oxide film ($SiO_2$) increases as the amount of added sulfuric acid ($H_2SO_4$) increases.

As a result of further investigation, the inventor has recognized that accuracy in size and shape is improved by adding an oxidizing agent to the etching liquid.

For example, when an etching liquid having a small proportion of sulfuric acid ($H_2SO_4$) is used, as described with reference to FIG. 3A, the polysilicon layer 3 (silicon, Si) may be removed to some extent. In this case, if the surface of the polysilicon layer 3 (silicon, Si) can be oxidized to form a thin oxide film ($SiO_2$), the etching rate of this portion is comparable with that of the coating oxide film 5 ($SiO_2$), and its removal can be prevented. This also implies that accuracy in shape and size can be improved under the etching condition having high productivity.

Here, the surface of silicon (Si) can be oxidized by adding an oxidizing agent. Any oxidizing agents can be used unless they cause metal contamination. Specific examples include ammonium peroxodisulfate, hydrogen peroxide, and ozone. Here, because ozone is gaseous, ozone is not directly added, but dissolved in water ($H_2O$) or the like by bubbling before addition. It is also possible to use a plurality of oxidizing agents as a mixture.

Figure 6A:
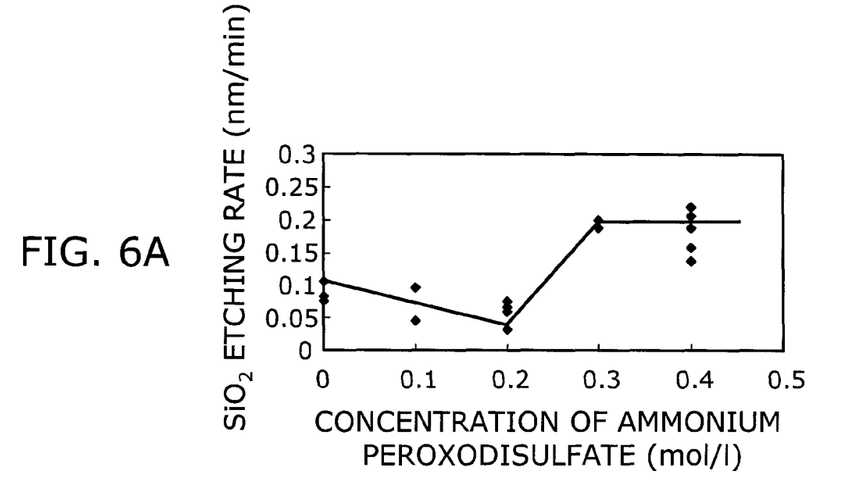
FIG. 6 is a diagram for illustrating the effect of adding an oxidizing agent.
Figure 6B:
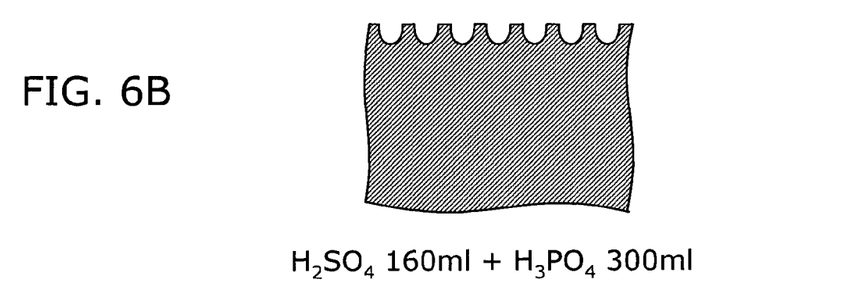
Figure 6C:
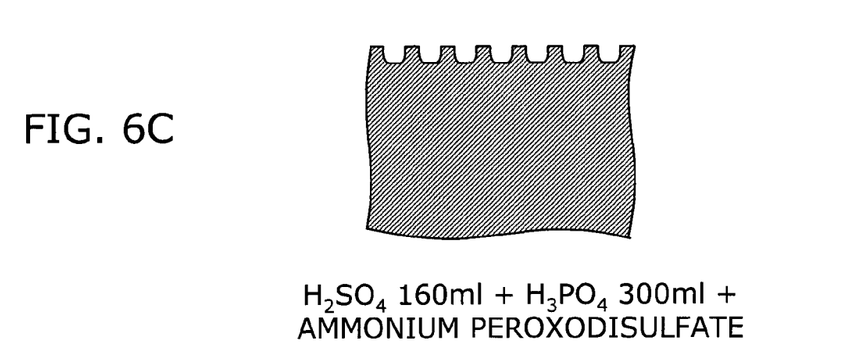

FIG. 6A is a graph for illustrating the effect of adding an oxidizing agent. FIGS. 6B and 6C are schematic cross-sectional views of a wafer for illustrating the effect of adding an oxidizing agent.

The configuration of the wafer cross section is similar to that described with reference to FIG. 3A, and hence is not described here. In FIG. 6A, the horizontal axis represents the concentration of ammonium peroxodisulfate, and the vertical axis represents the etching rate of silicon oxide film ($SiO_2$). In FIG. 6B, the etching liquid is a mixture of 300 ml of phosphoric acid ($H_3PO_4$) and 160 ml of sulfuric acid. In FIG. 6C, the etching liquid is a mixture of 300 ml of phosphoric acid ($H_3PO_4$), 160 ml of sulfuric acid, and 0.2 mol/l of ammonium peroxodisulfate. In FIGS. 6A, 6B, and 6C, the treatment temperature is all 160° C.

It is seen from FIG. 6A that the etching rate of silicon oxide film ($SiO_2$) is minimized when the concentration of ammonium peroxodisulfate is 0.2 mol/l. Here, a preferable concentration of ammonium peroxodisulfate is illustratively about not less than 0.1 mol/l and not more than 0.3 mol/l.

In the configuration resulting from addition of ammonium peroxodisulfate as shown in FIG. 6C, as compared with FIG. 6B, the corners (of the peaks) of the polysilicon layer 3 remain, and the width (of the peaks) is thicker. This indicates that addition of an oxidizing agent (ammonium peroxodisulfate) further improves accuracy in size and shape.

FIG. 7 is a schematic cross-sectional view of a wafer for illustrating the effect of an acid and an oxidizing agent.

Figure 7A:
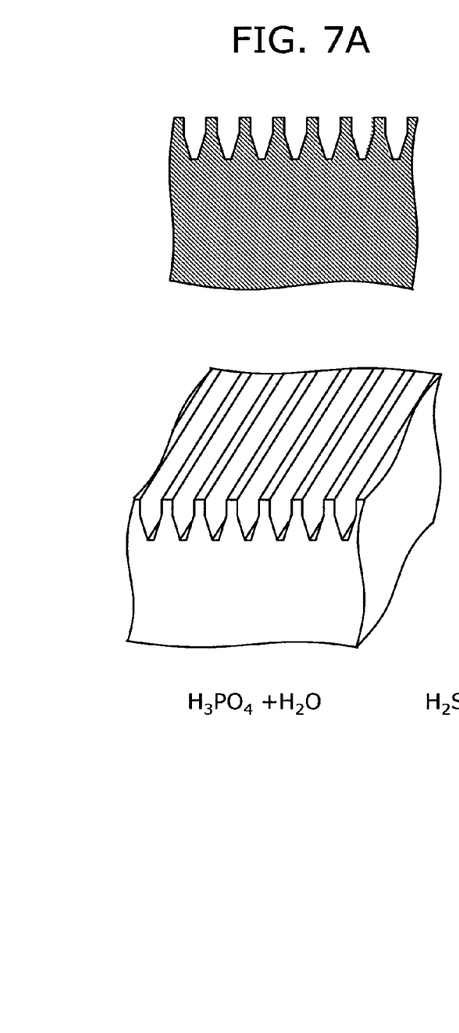
FIG. 7 is a schematic cross-sectional view of a wafer for illustrating the effect of an acid and an oxidizing agent.
Figure 7B:
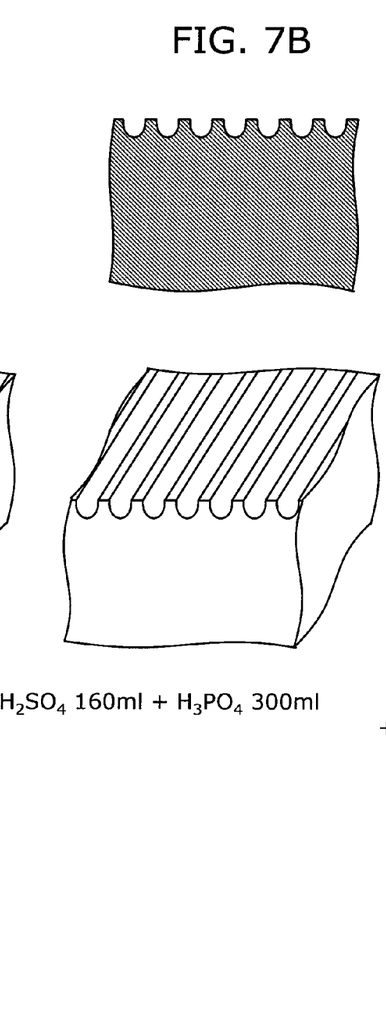
Figure 7C:
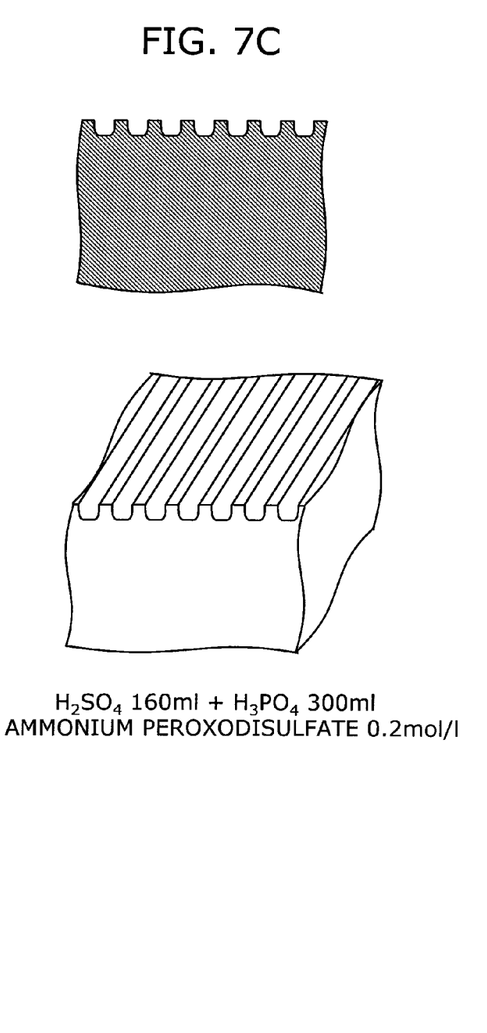

FIG. 7A shows the result of the conventional hot phosphoric acid process. That is, phosphoric acid ($H_3PO_4$) is used as the etching liquid. In FIG. 7B, the etching liquid is a mixture of 300 ml of phosphoric acid ($H_3PO_4$) and 160 ml of sulfuric acid. In FIG. 7C, the etching liquid is a mixture of 300 ml of phosphoric acid ($H_3PO_4$), 160 ml of sulfuric acid, and 0.2 mol/l of ammonium peroxodisulfate. The treatment temperature is 160° C. in all cases. In each figure, the upside is a schematic cross-sectional view, and the downside is a schematic perspective cross-sectional view.

As shown in these schematic cross-sectional views, each of the effects of an acid and an oxidizing agent described above contributes to an etching treatment having high accuracy in size and shape. That is, addition of an acid to phosphoric acid ($H_3PO_4$) prevents unnecessary removal of silicon oxide film ($SiO_2$), and further addition of an oxidizing agent prevents unnecessary removal of silicon (Si) as well.

Next, an etching method based on an etching liquid according to the embodiment of the invention is described.

FIG. 8 is a schematic cross-sectional process diagram for illustrating an etching method based on an etching liquid according to the embodiment of the invention.

For convenience, etching of a device isolation film portion having STI (Shallow Trench Isolation) structure is described.

Figure 8A:
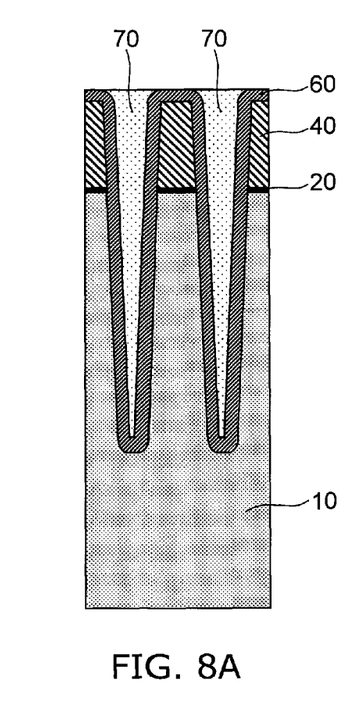
FIG. 8 is a schematic cross-sectional process diagram for illustrating an etching method based on an etching liquid according to the embodiment of the invention.

In FIG. 8A, a coating oxide film 70 is buried in a trench T. A brief description is given of the process until the coating oxide film 70 is buried. First, on a silicon layer 10 made of single crystal silicon, an insulating film 20 made of silicon oxide ($SiO_2$) and a mask 40 made of silicon nitride ($Si_3N_4$) are deposited sequentially from below. The deposition can be performed by the chemical vapor deposition technique, for example. Next, a trench T is formed by e.g. the RIE (Reactive Ion Etching) technique. Then a high-temperature oxide film (HTO film) 60 and a coating oxide film 70 are deposited sequentially from below. The coating oxide film 70 is made of silicon oxide ($SiO_2$) and deposited by applying a coating liquid for forming silica-based coating.

Figure 8B:
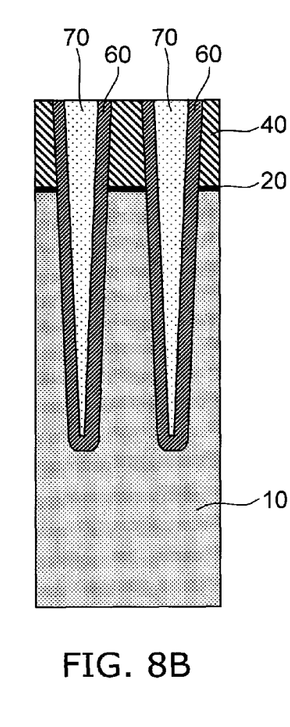

Next, as shown in FIG. 8B, the surface is planarized by the CMP (Chemical Mechanical Polishing) technique. At this time, the mask 40 ($Si_3N_4$) serves as a stopper film.

Figure 8C:
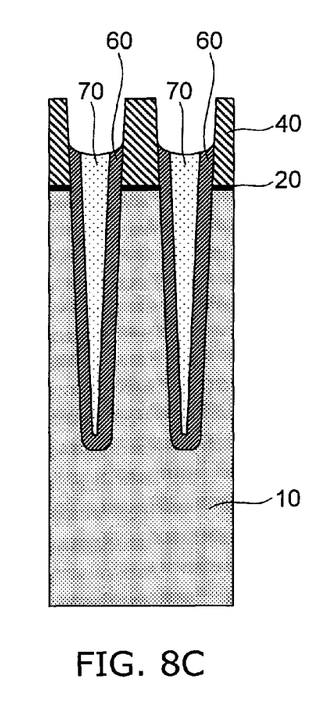

Next, as shown in FIG. 8C, the mask 40 is used as a hard mask to remove the upper face portion of the coating oxide film 70 and the high-temperature oxide film (HTO film) 60 by the reactive ion etching technique.

Figure 8D:
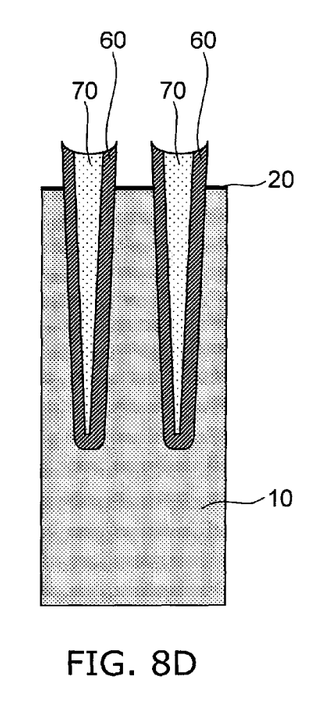

Then, as shown in FIG. 8D, the mask 40 ($Si_3N_4$) is removed by the etching method based on the etching liquid according to the embodiment of the invention. Here, the treatment temperature is about 160° C., and the treatment time is about 20 to 90 minutes. The composition of the etching liquid is as described above, where the proportion of the acid and/or oxidizing agent can be appropriately adjusted to achieve a desired accuracy in size and shape and productivity.

As described above, water ($H_2O$) does not need separately adding because it is contained in phosphoric acid ($H_3PO_4$). For example, when the etching liquid is a mixture of 300 ml of 85% phosphoric acid ($H_3PO_4$) and 160 ml of 96% sulfuric acid ($H_2SO_4$), 51.4 ml of water ($H_2O$) is contained therein.

In fact, water ($H_2O$) may need replenishing to compensate for evaporation due to long-term heating. Then the additional amount of water can be adjusted with reference to the specific gravity and boiling point of the mixture liquid.

Next, a method of manufacturing a semiconductor device using an etching liquid according to the embodiment of the invention is described. This method of manufacturing a semiconductor device is based on the etching method according to the embodiment of the invention described above. The method is carried out by repeating a plurality of steps including the step of patterning a wafer surface by deposition, resist application, exposure, development, etching, and resist removal, as well as the steps of inspection, cleaning, heat treatment, doping, diffusion, and planarization. Except the etching method according to the embodiment of the invention described above, known techniques can be adapted to each step, and hence are not described in detail.

For convenience, the etching method according to the embodiment of the invention is described with reference to a method of manufacturing a semiconductor device, but is not limited thereto. For example, the invention is also applicable to pattern etching in manufacturing liquid crystal displays, pattern etching in manufacturing phase shift masks, and etching of antireflective coating in manufacturing solar cells.

The above description refers to phosphoric acid ($H_3PO_4$) in the context of the hot phosphoric acid process. However, the invention is not limited to phosphoric acid ($H_3PO_4$), but any material can be used if it can be mixed with water ($H_2O$) so that the mixture (etching liquid) has a boiling point of 150° C. or more. This is because, when the mixture has a boiling point of 150° C. or more, $OH^-$ required for etching can be produced from water ($H_2O$). Examples of such material include triethylene glycol and sulfolane. Furthermore, the material mixed with water ($H_2O$) is not limited to a simple substance, but may be a mixture of an appropriate combination of various materials.

The boiling point of the mixture can also be adjusted by adjusting the mixing ratio with water ($H_2O$). Consequently, the amount of produced $OH^-$ can be adjusted, and hence the etching rate can be adjusted. For example, the boiling point of the mixture can be set to about 160° C. by adjustment such that phosphoric acid ($H_3PO_4$) not containing water ($H_2O$): water ($H_2O$)=85:15

In the foregoing, sulfuric acid ($H_2SO_4$) is described as an example that can produce $H^+$ and has a boiling point of 150° C. or more. However, the invention is not limited thereto. For example, nitric acid, hydrochloric acid, or oxalic acid can also be used as an acid having a boiling point of 150° C. or more. Here, it is preferable that the acid have a higher pH value than that added for setting the boiling point of the mixture to 150° C. or more (e.g. phosphoric acid). Considering the decomposition of the acid by heating, acids of modest molecular weight such as inorganic acids are more preferable.

The embodiment of the invention has been described with reference to the examples. However, the invention is not limited to these examples.

The above examples can be appropriately modified by those skilled in the art, and such modifications are also encompassed within the scope of the invention as long as they include the features of the invention.

For example, STI (Shallow Trench Isolation) structure is used as the device isolation structure in the foregoing. However, LOCOS (Local Oxidation of Silicon) or other structures may also be used.

Furthermore, in the foregoing, polysilicon is illustratively used as an object to be etched. However, single crystal silicon or silicon doped with phosphorus (P) may also be used.

Furthermore, in the foregoing, coating oxide film ($SiO_2$) is illustratively used as an object to be etched. However, silicon oxide film ($SiO_2$) deposited by the chemical vapor deposition technique may also be used.

The invention claimed is:

1. An etching method comprising:
   selectively etching a silicon nitride film on a polysilicon layer protruding from a porous silicon oxide coating film at an etching rate which is higher than an etching rate of the polysilicon layer and an etching rate of the porous silicon oxide coating film by using an etching liquid, the etching liquid including:
water;
phosphoric acid;
sulfuric acid; and
an oxidizing agent including ammonium peroxodisulfate to be contained at not less than 0.1 mol/l and not more than 0.3 mol/l.

2. The etching method according to claim 1, wherein a volume ratio of the phosphoric acid to the sulfuric acid is 150:300 to 300:32.

3. A method of manufacturing an electronic component comprising:
selectively etching a silicon nitride film on a polysilicon layer protruding from a porous silicon oxide coating film at an etching rate which is higher than an etching rate of the polysilicon layer and an etching rate of the porous silicon oxide coating film by using an etching liquid, the etching liquid including:
water;
phosphoric acid;
sulfuric acid; and
an oxidizing agent including ammonium peroxodisulfate to be contained at not less than 0.1 mol/l and not more than 0.3 mol/l.

4. The method of manufacturing an electronic component according to claim 3, wherein the electronic component is a semiconductor device, and the semiconductor device has a device isolation film of STI (Shallow Trench Isolation) structure or LOCOS (Local Oxidation of Silicon) structure.

* * * * *